US010848186B2

(12) United States Patent
Asthana et al.

(10) Patent No.: US 10,848,186 B2
(45) Date of Patent: Nov. 24, 2020

(54) FAULT DETECTION CIRCUITRY

(71) Applicant: Arm Limited, Cambridge (GB)

(72) Inventors: Vivek Asthana, Noida (IN); Jitendra Dasani, Cupertino, CA (US); Amit Chhabra, Noida (IN)

(73) Assignee: Arm Limited, Cambridge (GB)

( * ) Notice: Subject to any disclaimer, the term of this patent is extended or adjusted under 35 U.S.C. 154(b) by 18 days.

(21) Appl. No.: 15/896,015

(22) Filed: Feb. 13, 2018

(65) Prior Publication Data

US 2019/0253084 A1 Aug. 15, 2019

(51) Int. Cl.
| | | |
|---|---|---|
| *G11C 8/00* | (2006.01) | |
| *H03M 13/00* | (2006.01) | |
| *G11C 16/08* | (2006.01) | |
| *G11C 8/08* | (2006.01) | |
| *G11C 8/10* | (2006.01) | |
| *G11C 8/18* | (2006.01) | |
| *G11C 11/418* | (2006.01) | |
| *G11C 29/02* | (2006.01) | |
| *G11C 11/41* | (2006.01) | |

(52) U.S. Cl.
CPC .......... *H03M 13/611* (2013.01); *G11C 8/08* (2013.01); *G11C 8/10* (2013.01); *G11C 8/18* (2013.01); *G11C 11/418* (2013.01); *G11C 16/08* (2013.01); *G11C 29/024* (2013.01); *G11C 11/41* (2013.01)

(58) Field of Classification Search
CPC ........ G11C 11/41; G11C 11/418; G11C 16/08

USPC .......................................................... 365/230
See application file for complete search history.

(56) References Cited

U.S. PATENT DOCUMENTS

| | | | | |
|---|---|---|---|---|
| 5,644,312 | A * | 7/1997 | Deevy | H03M 7/165 341/159 |
| 7,848,173 | B1 * | 12/2010 | Su | G11C 8/10 365/189.08 |
| 2005/0036360 | A1 * | 2/2005 | Chen | G11C 8/08 365/154 |
| 2017/0040043 | A1 * | 2/2017 | Weiner | G11C 8/10 |
| 2017/0053685 | A1 * | 2/2017 | Kulkarni | G11C 8/10 |
| 2017/0357829 | A1 * | 12/2017 | Park | H03K 5/24 |

* cited by examiner

*Primary Examiner* — Hoai V Ho
*Assistant Examiner* — Minh Dinh
(74) *Attorney, Agent, or Firm* — Pramudji Law Group PLLC; Ari Pramudji

(57) ABSTRACT

Various implementations described herein are directed to an integrated circuit. The integrated circuit may include first decoding circuitry that receives an address and partially decodes the address to generate a partially decoded address. The integrated circuit may include second decoding circuitry that receives the partially decoded address, generates a decoded address, and provides the decoded address to a wordline. The integrated circuit may include encoding circuitry that receives the decoded address from the wordline and encodes the decoded address to generate an encoded address. The integrated circuit may include comparing circuitry that receives the encoded address and compares the encoded address with the address to detect faults in the memory circuitry.

20 Claims, 6 Drawing Sheets

FAULT DETECTION CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

FIG. 1 illustrates effects and/or damage of a focused laser beam on a circuit 100 that may be attributed to a laser attack or similar hostile intrusion. As such, FIG. 1 shows one example representation of how some laser attacks may affect the functioning of a physical circuit. The circuit 100 is shown as a transistor level design on a substrate 102 having a front side 110 and a back side 112. In reference to the front side 110, a first focused laser beam 120 may penetrate one or more layers of the circuit 100 and cause an abrasion 130 (fault or defect) relative to a layer 104 associated with various transistors 106. In reference to the back side 112, a second focused laser beam 122 may penetrate the substrate 102 of the circuit 100 and cause another abrasion 132 (or another fault or defect) relative to the layer 104 associated with the various transistors 106.

BRIEF DESCRIPTION OF THE DRAWINGS

Implementations of various fault detection techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to fault detection circuitry. For instance, various implementations described herein are directed to schemes, techniques and methods related to fault detection for memory applications including, in some cases, wordline fault detection for memory circuits as a security feature for detecting laser attacks and/or various other types of hostile intrusions.

Generally, security features are gradually being identified as an important part of physical circuit designs, e.g., in types of applications related to automotive, memory, smart cards, mobile devices, and Internet of Things (IoT) systems. Security features may involve designing physical circuits in manner so as to at least inhibit or prevent malfunction and/or data loss by laser attacks and various other side channel attacks. For instance, in memory circuitry, laser attacks on wordlines and/or pre-decoder lines may lead to wrong wordline selection and/or multiple wordline or no wordline selection.

As described herein, the fault detection circuitry may deploy encoder circuitry that encodes a wordline back to an encoded address. The fault detection circuitry may deploy comparator circuitry to detect faults, such as, e.g., a wrong wordline selection fault, by comparing the encoded address with the address received from the memory circuitry, which may be part of a system on a chip (SoC). The fault detection circuitry may deploy comparator circuitry to detect multiple wordlines (e.g., double wordlines) or no wordline selection fault by comparing the bit (B) and bit-bar (Bb) of encoded address bits.

Various implementations of fault detection circuitry will now be described in greater detail herein with reference to FIGS. 2-6.

Figure 1:
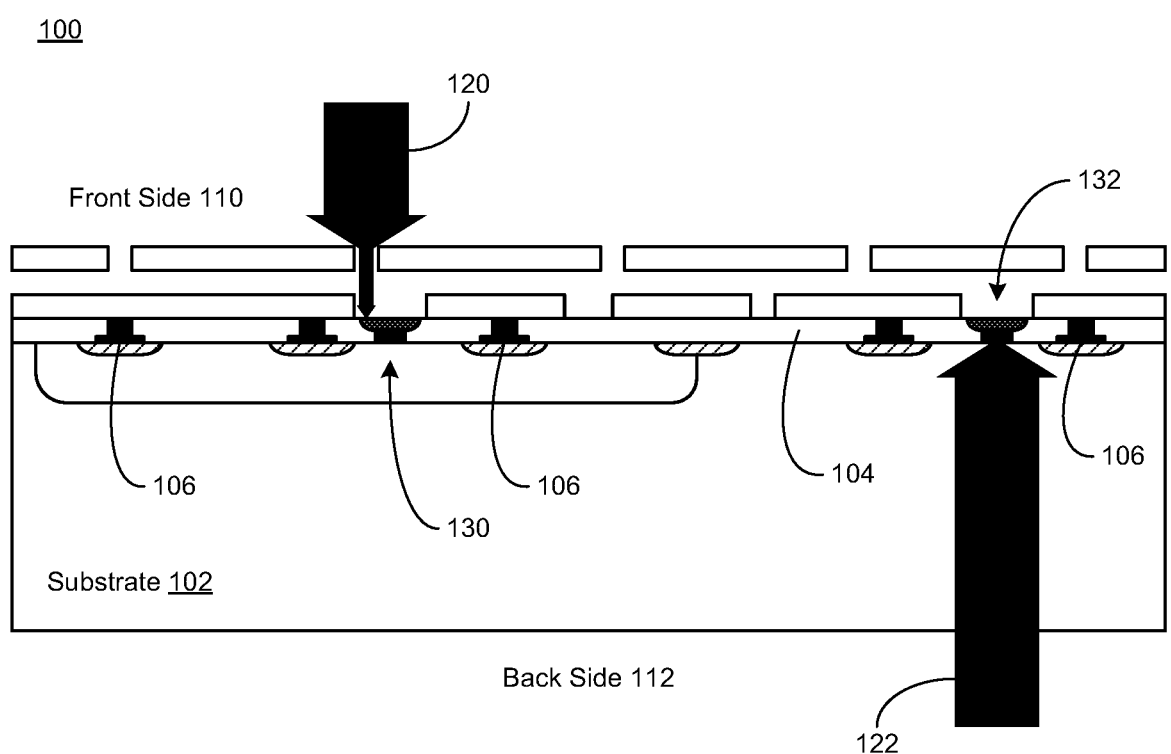
FIG. 1 illustrates effects and/or damage of a focused laser beam on a circuit that may be attributed to a laser attack or similar hostile intrusion.
Figure 2:
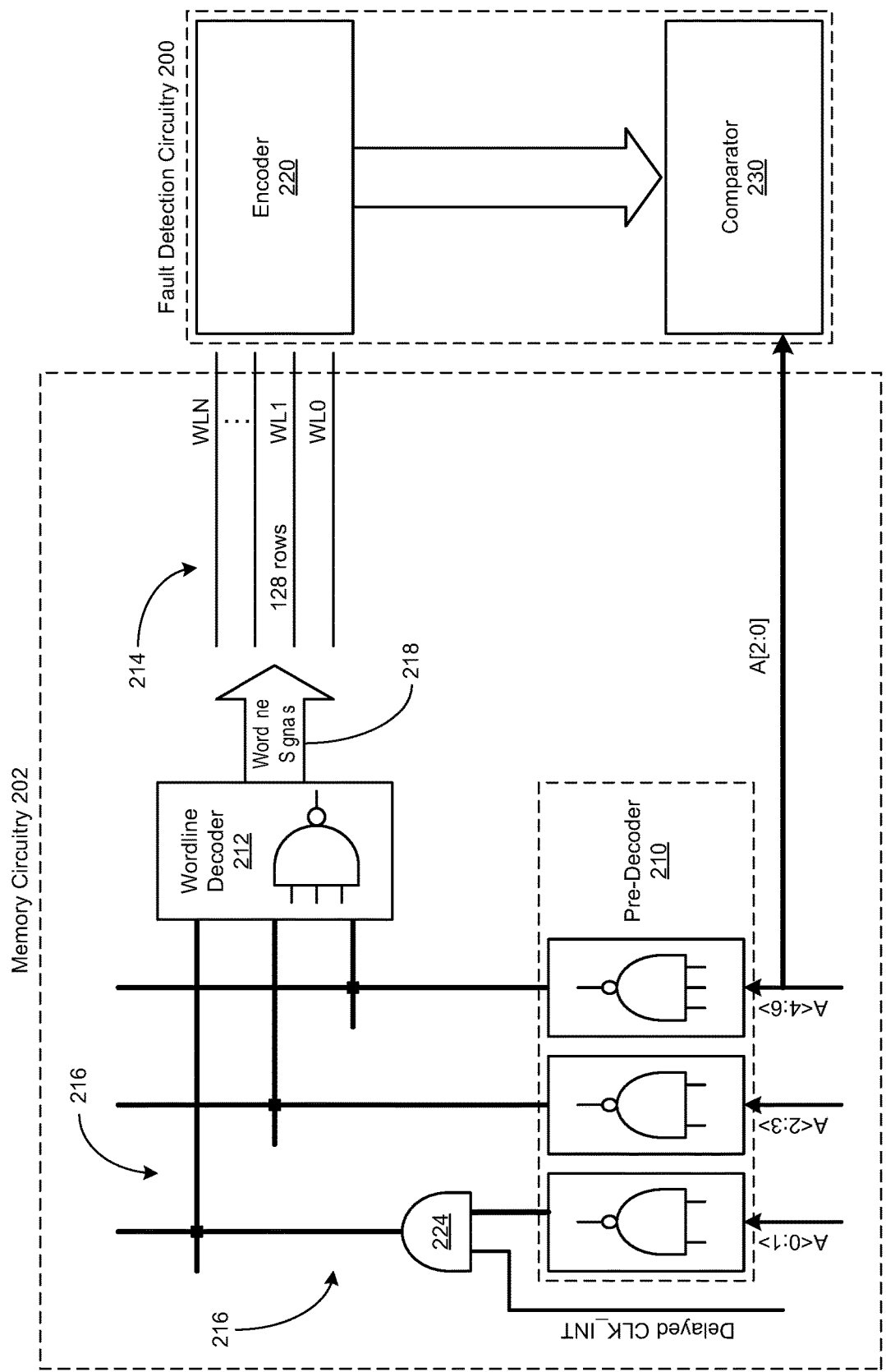
FIG. 2 illustrates a block diagram of fault detection circuitry in accordance with various implementations described herein.

FIG. 2 illustrates a diagram of fault detection circuitry 200 in accordance with various implementations described herein.

The fault detection circuitry 200 may be implemented as an integrated circuit (IC) in various types of memory circuitry 202, such as, e.g., random access memory (RAM), including static RAM (SRAM), and/or any other type of memory. The integrated circuit (IC) may be referred to as a memory fault detector that provides a security feature for detecting laser attacks or other hostile intrusions imposed on memory circuitry 202. In some cases, the memory circuitry 202 may be implemented as an IC with dual rail memory architecture and related circuitry. In some other cases, the memory circuitry 202 may be integrated with computing circuitry and related components on a single chip. Further, the memory circuitry 202 may be implemented in an embedded system for various electronic and mobile applications, including low power sensor nodes.

In some implementations, the memory circuitry 202 may include an array of memory cells, wherein each memory cell may be referred to as a bitcell. Each memory cell may be configured to store at least one data bit value (e.g., a data value related to a logical '0' or '1'). In various instances, the array of memory cells may include any number of memory cells arranged in various configurations, such as, e.g., a two-dimensional (2D) memory array having columns and rows of multiple memory cells arranged in a 2D grid pattern with 2D indexing capabilities.

Further, each memory cell may be implemented with RAM circuitry, or some other type of volatile memory. For instance, each memory cell may include a multi-transistor SRAM cell, including various types of SRAM cells, such as, e.g., 6T CMOS SRAM and/or other types of complementary MOS (CMOS) SRAM cells, such as, e.g., 4T, 8T, 10T, or more transistors per bit. The memory circuitry 202 may operate at a source voltage level Vdd with a voltage range that varies with specific technologies.

As shown in FIG. 2, the memory circuitry 202 may include first decoding circuitry 210 that receives an address (A<0:1>, A<2:3>, A<4:6>) from another system component, such as, e.g., the SoC, and partially decodes the address (A<0:1>, A<2:3>, A<4:6>) so as to generate a partially decoded address. The first decoding circuitry 210 may be referred to as a pre-decoder or pre-decoder circuitry. The first decoding circuitry 210 may include one or more address inverters that generate a complementary address from the address (A<0:1>, A<2:3>, A<4:6>) and partially decode the address (A<0:1>, A<2:3>, A<4:6>) based on the complementary address and the address address (A<0:1>, A<2:3>, A<4:6>). Further, the first decoding circuitry 210 may provide the partially decoded address to one or more pre-decoded signal lines 216.

In some implementations, the memory circuitry 202 may include a logic gate 224, such as, e.g., an AND gate, that receives multiple inputs and provides an output to at least one of the pre-decoded signal lines 216. As shown, the logic gate 224 may receive a first input signal from the first decoding circuitry 210, and the logic gate 224 may receive a second input signal from an internal clock, such as, e.g., a delayed CLK_INT signal. Based on these received input signals, the logic gate 224 may provide an output to at least one of the pre-decoded signal lines 216.

The memory circuitry 202 may include second decoding circuitry 212 that receives the partially decoded address from the first decoding circuitry 210, generates a decoded address, and provides the decoded address to at least one wordline 214 (WL0, WL1, . . . , WLN). The second decoding circuitry 212 may be referred to as a wordline decoder or wordline decoding circuitry. As shown, the at least one wordline 214 may be selected from multiple wordlines (WL0, WL1, . . . , WLN), which may be associated with any number of rows, such as, e.g., 128 rows, where N=128. In some implementations, the second decoding circuitry 212 may receive the partially decoded address from the first decoding circuitry 210 via the one or more pre-decoded signal lines 216. The second decoding circuitry 212 may generate at least one wordline signal 218 for the at least one wordline 214 (WL0, WL1, . . . , WLN). Further, the at least one wordline signal 218 may be associated with the decoded address.

The fault detection circuitry 200 may include encoding circuitry 220 that receives the decoded address from the at least one wordline 214 (WL0, WL1, . . . , WLN) and encodes the decoded address to generate an encoded address. The encoding circuitry 220 may be referred to as an encoder. In some implementations, the encoding circuitry 220 may include a read-only memory (ROM) configuration. The encoding circuitry 220 will be described in more detail with reference to FIG. 3.

The fault detection circuitry 200 may include comparing circuitry 230 that receives the encoded address from the encoding circuitry 220 and compares the encoded address with the address (A<0:1>, A<2:3>, A<4:6>) to detect faults (or defects or abrasions) in the memory circuitry 202. The comparing circuitry 230 may be referred to as a comparator. In some implementations, the comparing circuitry 230 may receive the address (A<0:1>, A<2:3>, A<4:6>) from the memory circuitry 202. Further, the comparing circuitry 230 may compare the encoded address with the address (A<0:1>, A<2:3>, A<4:6>) so as to confirm validity of the address (A<0:1>, A<2:3>, A<4:6>) received from the memory circuitry 202. The comparing circuitry 230 may detect faults (or defects or abrasions) in the memory circuitry 202, e.g., by detecting a wrong wordline (WL) selection fault. In this instance, a wrong wordline (WL) selection fault may be detected, e.g., by comparing the encoded address with the address (A<0:1>, A<2:3>, A<4:6>) from the memory circuitry 202. The comparing circuitry 230 may detect faults (or defects or abrasions) in the memory circuitry 202, e.g., by detecting multiple wordlines 214 (WL0, WL1, . . . , WLN) or a no wordline selection fault. In this instance, multiple wordlines 214 (WL0, WL1, . . . , WLN) or a no wordline selection fault may be detected, e.g., by comparing a bit bitline (B0, B1, B2) and a bit-bar bitline (B0b, B1b, B2b) of encoded address bits from the encoded address. These and other features related to the comparing circuitry 230 are described in reference to FIGS. 4-5.

Figure 3:
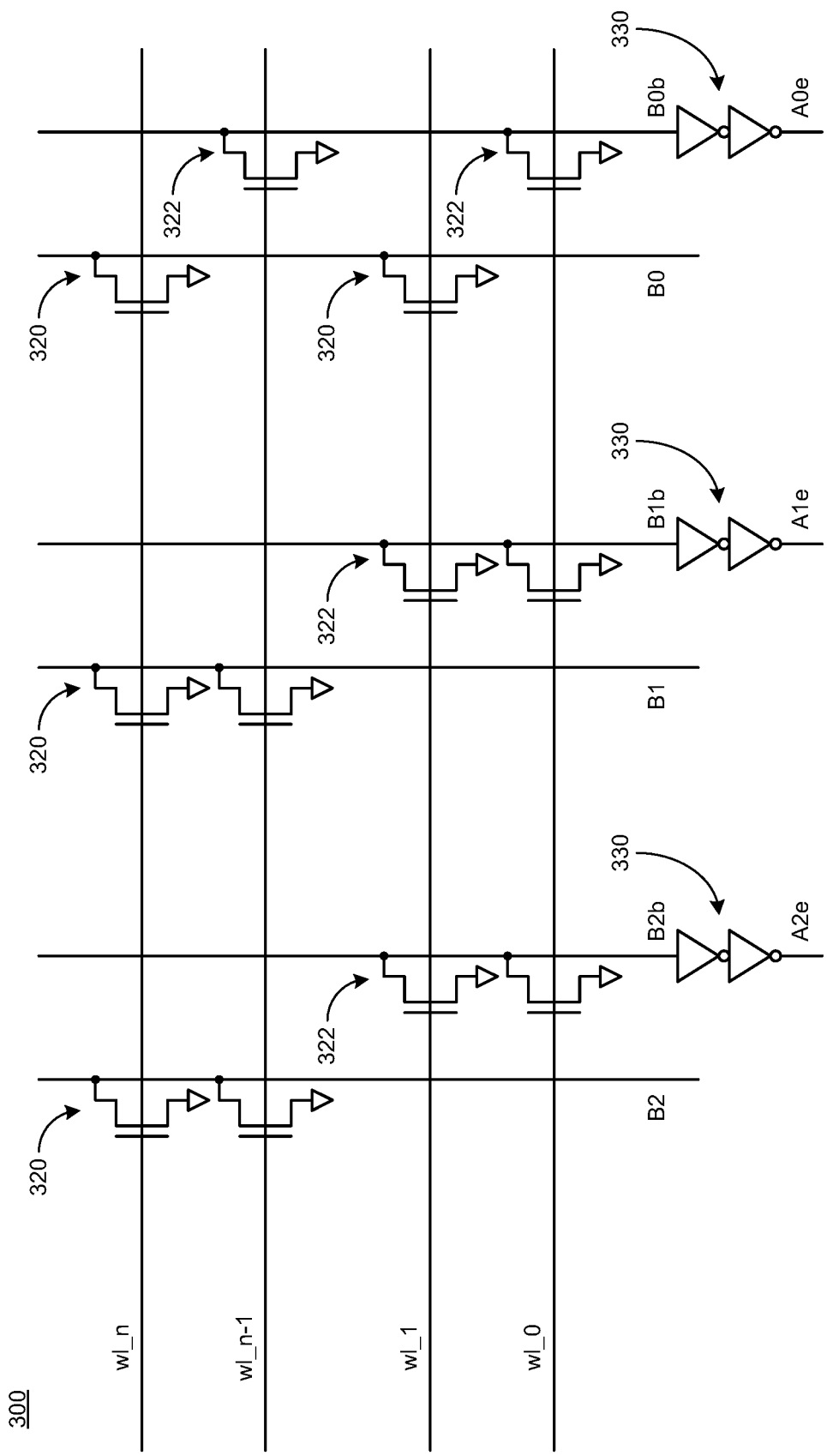
FIG. 3 illustrates a diagram of encoder circuitry in accordance with various implementations described herein.

FIG. 3 illustrates a diagram of encoder circuitry 300 in accordance with various implementations described herein.

As shown in FIG. 3, the encoder circuitry 300 may include any number of wordlines (w1_0, w1_1, . . . , w1_n−1, w1_n) and any number of bitlines (B0, B0b, B1, B1b, B2, B2b). The bitlines may be implemented as bitline pairs, wherein each bitline pair includes a bit bitline (B) and complementary bit-bar bitline (Bb). For instance, a first bitline pair may include (B0, B0b), a second bitline pair may include (B1, B1b), and a third bitline pair may include (B2, B2b), and so on. In some implementations, the encoder circuitry 300 may be embodied with a read-only memory (ROM) configuration having, e.g., a reduced area or minimum area. The encoder circuitry 300 may include one or more bitline transistors 320 that may be placed on a bit bitline (B0, B1, B2), and one or more transistors 322 that may be placed on a bit-bar bitline (B0b, B1b, B2b) and not on the bit bitline (B0, B1, B2).

In some implementations, the transistors 320, 322 may be implemented with N-type metal-oxide-semiconductor (NMOS) transistors that are coupled to the bitlines (B0, B0b, B1, B1b, B2, B2b), and the transistors 320, 322 may be activated based on a selected wordline (w1_0, w1_1, . . . , w1_n−1, w1_n). In other implementations, the transistors 320, 322 may be implemented with P-type MOS (PMOS) transistors. Further, one or more inverters 330 may be coupled to the bit-bar bitlines (B0b, B1b, B2b), wherein the output of the inverters provides a buffered signal. For instance, a first bitline signal provided to bit-bar bitline B0b is received by multiple inverters 330 and a first buffered signal is output from the inverters 330 as a first encoded address A0e. Similarly, a second bitline signal B1b is output as a second encoded address A1e, and a third bitline signal B2b is output as a third encoded address A2e.

The encoder-bitlines, such as, e.g., bit bitlines (B) and bit-bar bitlines (Bb), may be precharged to Vdd, and the encoder-bitlines may discharge if there is an NMOS transistor coupled to the selected wordline (WL). The NMOS transistors 320, 322 are programmed on the wordline and on the encoder-bitline intersections as per a wordline sequence. For instance, for a first wordline (WL0), the NMOS transistors are coupled to each of the bit-bar bitlines (Bb), such that, when WL0 is selected, binary logic sequence (000) is provided as the encoder output address bus. In this instance, using NMOS 320, 322 connections as shown allows the encoder 300 to encode the WL0 back to the original address.

Figure 4:
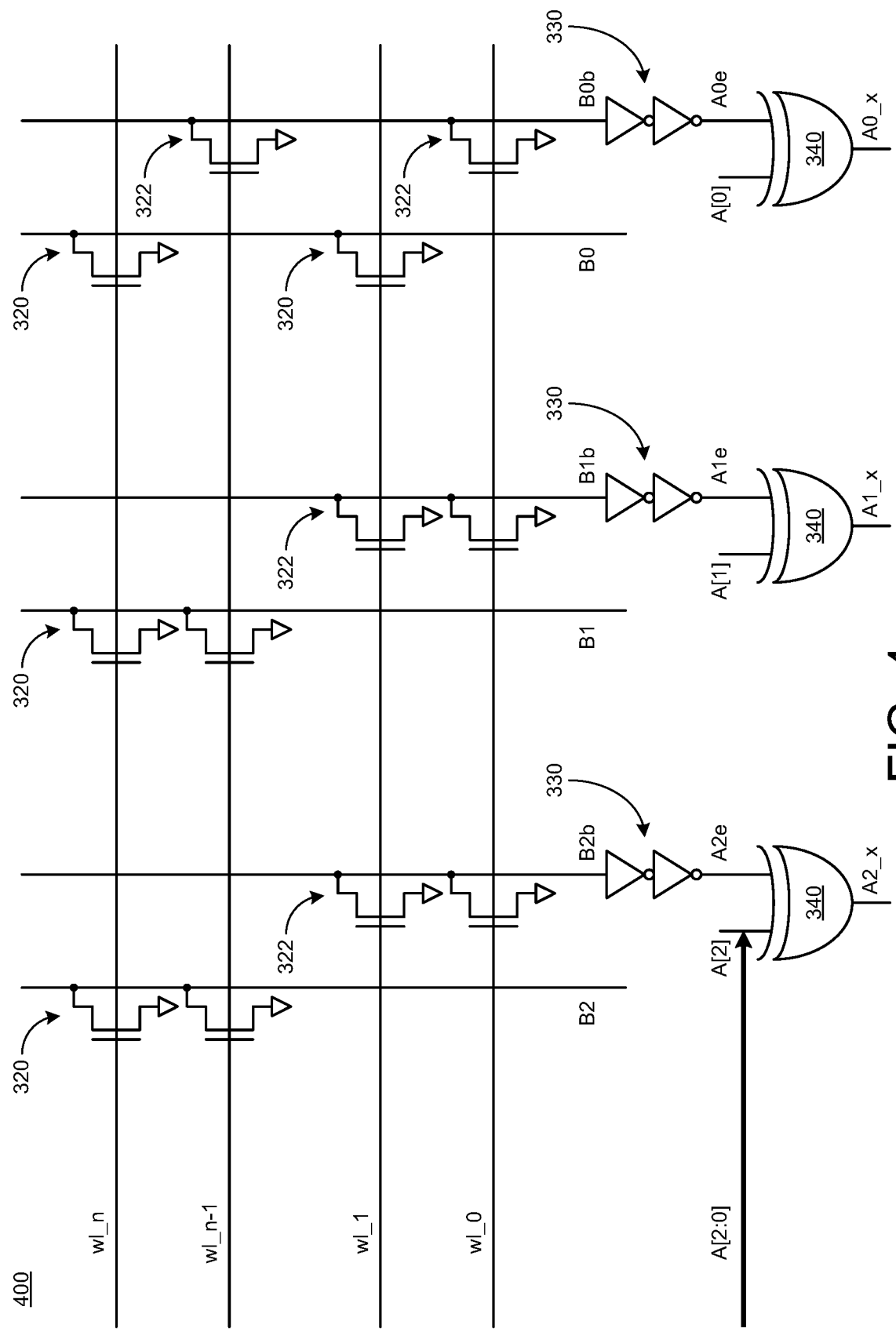
FIG. 4 illustrates a diagram of comparator circuitry in accordance with various implementations described herein.

FIG. 4 illustrates a diagram of comparator circuitry 400 in accordance with various implementations described herein.

As shown in FIG. 4, the comparator circuitry 400 may include one or more logic gates 340, such as, e.g., one or more XOR gates, coupled to the outputs A0e, A1e, A2e of the encoder circuitry 300 of FIG. 3. As shown, each of the logic gates 340 may receive a corresponding bit-bar bitline output (i.e., encoded address A0e, A1e, A2e) as a first input, and each of the logic gates 340 may receive the original address A[2:0] from memory circuitry as a second input. Further, each of the logic gates 340 may provide a corresponding output A0_x, A1_x, A2_x based on the received inputs (i.e., encoded address A0e, A1e, A2e, and original address A[2:0]). Various other types of logic gates (e.g., AND, NAND, OR, NOR, etc.) may be used to receive similar inputs and provide similar outputs.

In some implementations, the comparator circuitry 400 provides a comparator design that allows for detecting a wrong wordline (WL) selection. For instance, once an encoded-address (A0e, A1e, A2e) is received, it may be compared to the original input Address bus (A[2:0]) to determine whether there has been any tampering on the address bus inside the memory circuitry. In other implementations, the encoded address (A0e, A1e, A2e) and the original address (A[2:0]) are compared using XOR gates. In case of no fault, i.e., correct single wordline selection, all of the bits of the encoded address (A0e, A1e, A2e) should match the original address (A[2:0]=A[0], A[1], A[2]), respectively, and all of the XOR outputs (A0_x, A1_x, A2_x) should be low (e.g., logic 0). In case of a wrong wordline selection, one or more bits of the encoded address (A0e, A1e, A2e) should not match the original address (A[2:0]=A[0], A[1], A[2]), respectively, and then one or more of the XOR outputs (A0_x, A1_x, A2_x) should be high (e.g., logic 1), wherein a wrong wordline (WL) is selected thereby detecting a fault (or defect).

Figure 5:
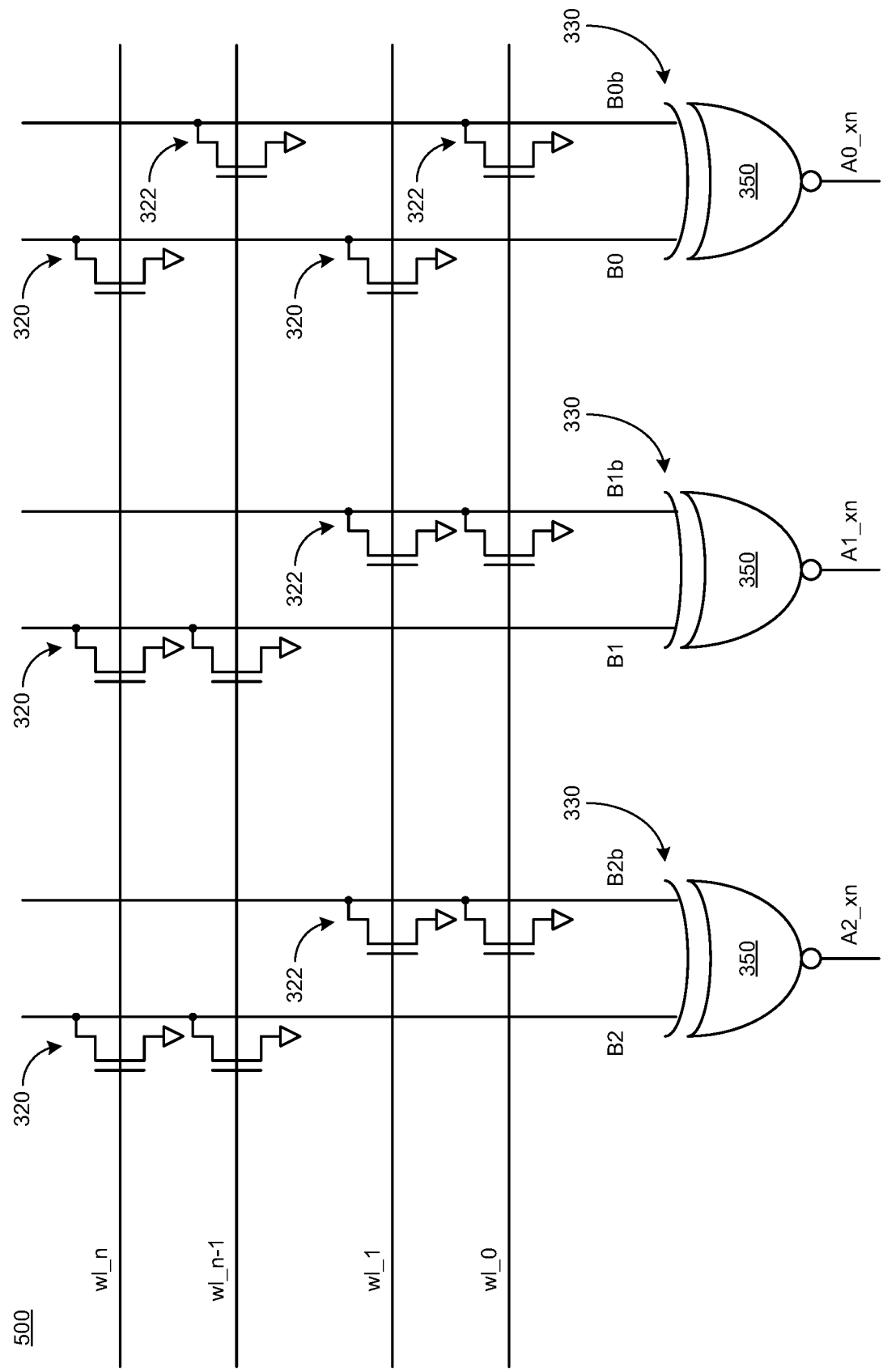
FIG. 5 illustrates a diagram of other comparator circuitry in accordance with various implementations described herein.

FIG. 5 illustrates a diagram of other comparator circuitry 500 in accordance with various implementations described herein.

As shown in FIG. 5, the comparator circuitry 500 may include one or more logic gates 350, such as, e.g., one or more XNOR gates, coupled to the bitline pairs (B0, B0b/B1, B1b/B2, B2b) of the encoder circuitry 300 of FIG. 3. As shown, each of the logic gates 350 may receive a bitline pair including a bit bitline (B) signal as a first input and a corresponding bit-bar bitline (Bb) signal as a second input. Further, each of the logic gates 350 may provide a corresponding output A0_xn, A1_xn, A2_xn based on the received inputs (i.e., B0, B0b/B1, B1b/B2, B2b). In some other implementations, various other types of logic gates (e.g., AND, NAND, OR, NOR, etc.) may be used to receive similar inputs and provide similar outputs.

In some implementations, the comparator circuitry 500 includes logic circuitry 350 that provides a comparator design with, e.g., one or more XNOR gates that allow for detecting multiple wordlines (e.g., double WL) or no wordline (WL) selection. As shown in FIG. 5, multiple wordlines (WLs) and no wordline (WL) selections may be detected by using the one or more XNOR gates at the bit bitlines (B0, B1, B2) and the bit-bar bitlines (B0b, B1b, B2b) of the encoded address. In case of no fault, i.e., correct single wordline selection, either of the bit bitlines (B0, B1, B2) and the bit-bar bitlines (B0b, B1b, B2b) for each encoded address bit should discharge, and all of the XNOR gate outputs should be low (e.g., logic 0). In case of multiple wordlines selection fault, both of the bit bitlines (B0, B1, B2) and the bit-bar bitlines (B0b, B1b, B2b) for one or more encoded address bits should discharge, and one or more of the XNOR gate outputs should be high (e.g., logic 1). In case of no wordline selection fault, both of the bit bitlines (B0, B1, B2) and the bit-bar bitlines (B0b, B1b, B2b) of the encoded address bits should remain pre-charged, and all XNOR gate outputs should be high (e.g., logic 1).

Figure 6:
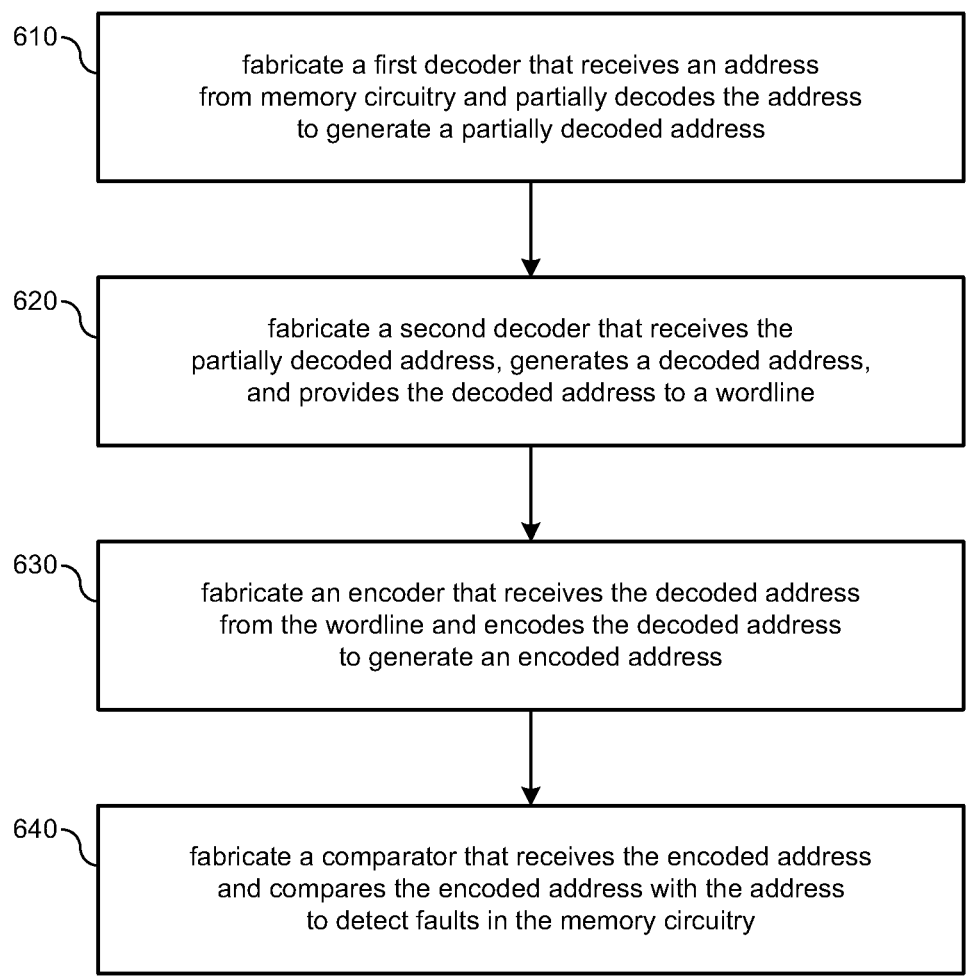
FIG. 6 illustrates a process diagram of a method for fabricating an integrated circuit with fault detection in accordance with implementations described herein.

FIG. 6 illustrates a process flow diagram of a method 600 for fabricating fault detection circuitry in accordance with implementations described herein.

It should be understood that even though method 600 may indicate a particular order of operation execution, in some cases, various certain portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various circuit elements, such as described herein above in reference to FIGS. 2-5. If implemented in software, method 600 may be implemented as a program or software instruction process that may be configured for fault detection circuitry as described herein. Further, if implemented in software, instructions related to implementing the method 600 may be stored in memory and/or a database. For instance, a computer or various other types of computing devices having a processor and memory may be configured to perform method 600.

As described and shown in reference to FIG. 6, method 600 may be utilized for manufacturing an integrated circuit (IC) that implements fault detection circuitry. The integrated circuit (IC) may be a memory fault detector that provides a security feature for detecting laser attacks or other hostile intrusions imposed on memory circuitry.

At block 610, method 600 may fabricate a first decoder that receives an address from the SoC and partially decodes the address to generate a partially decoded address. The first decoder may be referred to as a pre-decoder and/or as pre-decoding circuitry. The first decoder may include one or more address inverters that generate a complementary address from the address and partially decode the address based on the complementary address and the address. The first decoder may provide the partially decoded address to pre-decoded signal lines.

At block 620, method 600 may fabricate a second decoder that receives the partially decoded address, generates a decoded address, and provides the decoded address to a wordline. The second decoder may be referred to as a wordline decoder and/or as wordline decoding circuitry. The wordline may be at least one wordline selected from multiple wordlines. The second decoder may receive the partially decoded address from the first decoder via the pre-decoded signal lines. The second decoder may generate a wordline signal for the wordline, and the wordline signal is associated with the decoded address.

At block 630, method 600 may fabricate an encoder that receives the decoded address from the wordline and encodes the decoded address to generate an encoded address. The encoder may be referred to as encoding circuitry. The encoder may have a read-only memory (ROM) configuration, where one or more transistors may be placed on a bit-bar bitline (Bb) and not on a bit bitline (B).

At block 640, method 600 may fabricate a comparator that receives the encoded address and compares the encoded address with the address to detect faults in the memory circuitry. The comparator may be referred to as comparing circuitry. The comparator may receive the address from the memory circuitry, and the comparator may compare the encoded address with the address so as to confirm validity of the address received from the memory circuitry. The comparator may detect faults (or defects or abrasions) in the memory circuitry. For instance, the comparator may detect faults by detecting a wrong wordline selection fault. In this instance, a wrong wordline selection fault may be detected by comparing the encoded address with the address from the memory circuitry. In another instance, the comparator may detect faults (or defects or abrasions) in the memory circuitry by detecting multiple wordlines or a no wordline selection fault. In this instance, multiple wordlines or a no wordline selection fault may be detected by comparing a bit bitline (B) and a bit-bar bitline (Bb) of encoded address bits from the encoded address.

Described herein are various implementations of an integrated circuit. The integrated circuit may include first decoding circuitry that receives an address and partially decodes the address to generate a partially decoded address. The integrated circuit may include second decoding circuitry that receives the partially decoded address, generates a decoded address, and provides the decoded address to a wordline. The integrated circuit may include encoding circuitry that receives the decoded address from the wordline and encodes the decoded address to generate an encoded address. The integrated circuit may include comparing circuitry that receives the encoded address and compares the encoded address with the address to detect faults in the memory circuitry.

Described herein are various implementations of a memory fault detector. The memory fault detector may include a pre-decoder that receives an address, partially decodes the address to generate a partially decoded address, and provides the partially decoded address to pre-decoded signal lines. The memory fault detector may include a wordline decoder that receives the partially decoded address from the pre-decoder via the pre-decoded signal lines, generates a decoded address, generates a wordline signal that is associated with the decoded address, and provides the wordline signal to a wordline. The memory fault detector may include an encoder that receives the decoded address from the wordline and encodes the decoded address to generate an encoded address. The memory fault detector may include a comparator that receives the address from the memory circuit, receives the encoded address from the encoder, and compares the encoded address with the address to detect faults in the memory circuit.

Described herein are various implementations of a method of fabricating an integrated circuit. The method may include fabricating a first decoder that receives an address and partially decodes the address to generate a partially decoded address. The method may include fabricating a second decoder that receives the partially decoded address, generates a decoded address, and provides the decoded address to a wordline. The method may include fabricating an encoder that receives the decoded address from the wordline and encodes the decoded address to generate an encoded address. The method may include fabricating a comparator that receives the encoded address and compares the encoded address with the address to detect faults in the memory circuitry.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   first decoding circuitry that receives an encoded address and partially decodes the encoded address to generate a partially decoded address;
   second decoding circuitry that receives the partially decoded address, generates a decoded address, and provides the decoded address to a wordline;
   encoding circuitry that receives the decoded address from the wordline and encodes the decoded address to generate a re-encoded address; and
   comparing circuitry that receives the re-encoded address and compares the re-encoded address with the encoded address to detect faults in the memory circuitry.

2. The integrated circuit of claim 1, wherein the first decoding circuitry comprises one or more address inverters, and wherein the one or more address inverters generate a complementary address from the encoded address and partially decode the encoded address based on the complementary address and the encoded address.

3. The integrated circuit of claim 1, wherein the first decoding circuitry provides the partially decoded address to pre-decoded signal lines, and wherein the second decoding circuitry receives the partially decoded address from the first decoding circuitry via the pre-decoded signal lines.

4. The integrated circuit of claim 1, wherein the second decoding circuitry generates a wordline signal for the wordline, and wherein the wordline signal is associated with the decoded address.

5. The integrated circuit of claim 1, wherein the wordline comprises at least one wordline selected from multiple wordlines.

6. The integrated circuit of claim 1, wherein the encoding circuitry comprises a read-only memory (ROM) configuration having one or more transistors placed on a bit-bar bitline and not on a bit bitline.

7. The integrated circuit of claim 1, wherein the comparing circuitry receives the encoded address from the memory circuitry, and wherein the comparing circuitry compares the re-encoded address with the encoded address so as to confirm validity of the encoded address received from the memory circuitry.

8. The integrated circuit of claim 1, wherein the comparing circuitry compares the re-encoded address with the encoded address from the memory circuitry to detect a wrong wordline selection fault.

9. The integrated circuit of claim 1, wherein the comparing circuitry compares the encoded address with a bit bitline and a bit-bar bitline of re-encoded address bits from the re-encoded address to detect multiple wordlines or a no wordline selection fault.

10. The integrated circuit of claim 1, wherein the integrated circuit comprises a memory fault detector that provides a security feature for detecting laser attacks imposed on the memory circuitry.

11. A memory fault detector, comprising:
a pre-decoder that receives an encoded address, partially decodes the encoded address to generate a partially decoded address, and provides the partially decoded address to pre-decoded signal lines;
a wordline decoder that receives the partially decoded address from the pre-decoder via the pre-decoded signal lines, generates a decoded address, generates a wordline signal that is associated with the decoded address, and provides the wordline signal to a wordline;
an encoder that receives the decoded address from the wordline and encodes the decoded address to generate a re-encoded address; and
a comparator that receives the encoded address from the memory circuit, receives the re-encoded address from the encoder, and compares the re-encoded address with the encoded address to detect faults in the memory circuit.

12. The memory fault detector of claim 11, wherein the pre-decoder comprises address inverters that generate a complementary address from the encoded address and partially decodes the encoded address based on the complementary address and the encoded address.

13. The memory fault detector of claim 11, wherein the wordline comprises at least one wordline selected from multiple wordlines.

14. The memory fault detector of claim 11, wherein the encoder comprises multiple bitlines including one or more bitlines and one or more bit-bar bitlines, and wherein the encoder comprises a read-only memory (ROM) configuration, and wherein one or more transistors are placed on at least one of the bit-bar bitlines.

15. The memory fault detector of claim 11, wherein the comparator receives the encoded address from the memory circuit, and wherein the comparator compares the re-encoded address with the encoded address so as to confirm validity of the encoded address received from the memory circuit.

16. The memory fault detector of claim 11, wherein the comparator detects faults in the memory circuit by detecting a wrong wordline selection fault by comparing the re-encoded address with the encoded address from the memory circuit.

17. The memory fault detector of claim 11, wherein the comparator detects faults in the memory circuit by detecting multiple wordlines or no wordline selection fault by comparing a bit bitline and a bit-bar bitline of re-encoded address bits from the re-encoded address.

18. A method of fabricating an integrated circuit, comprising:
fabricating a first decoder that receives an encoded address and partially decodes the encoded address to generate a partially decoded address;
fabricating a second decoder that receives the partially decoded address, generates a decoded address, and provides the decoded address to a wordline;
fabricating an encoder that receives the decoded address from the wordline and encodes the decoded address to generate a re-encoded address; and
fabricating a comparator that receives the re-encoded address and compares the re-encoded address with the encoded address to detect faults in the memory circuitry.

19. The method of claim 18, wherein the first decoder comprises one or more address inverters that generate a complementary address from the encoded address and partially decode the encoded address based on the complementary address and the encoded address, and wherein the encoder comprises a read-only memory (ROM) configuration.

20. The method of claim 18, wherein the integrated circuit is a memory fault detector that provides a security feature for detecting laser attacks imposed on the memory circuitry.

* * * * *